United States Patent
Koike et al.

(10) Patent No.: US 7,965,569 B2
(45) Date of Patent: Jun. 21, 2011

(54) SEMICONDUCTOR STORAGE DEVICE

(75) Inventors: Tsuyoshi Koike, Kyoto (JP); Hidenari Kanehara, Kyoto (JP)

(73) Assignee: Panasonic Corporation, Osaka (JP)

( * ) Notice: Subject to any disclaimer, the term of this patent is extended or adjusted under 35 U.S.C. 154(b) by 82 days.

(21) Appl. No.: 12/201,384

(22) Filed: Aug. 29, 2008

(65) Prior Publication Data

US 2009/0067273 A1 Mar. 12, 2009

(30) Foreign Application Priority Data

Sep. 6, 2007 (JP) ................................. 2007-231208

(51) Int. Cl.
*G11C 7/00* (2006.01)

(52) U.S. Cl. ........................................ 365/203; 365/226

(58) Field of Classification Search ........................ None
See application file for complete search history.

(56) References Cited

U.S. PATENT DOCUMENTS

| | | | | |
|---|---|---|---|---|
| 5,859,799 | A * | 1/1999 | Matsumoto et al. | 365/189.09 |
| 6,327,198 | B1 * | 12/2001 | Kato et al. | 365/201 |
| 6,891,767 | B2 | 5/2005 | Chun et al. | |
| 6,982,899 | B2 | 1/2006 | Sumitani et al. | |
| 7,272,068 | B2 * | 9/2007 | Yamaoka et al. | 365/226 |
| 2006/0268647 | A1 * | 11/2006 | Yamaoka et al. | 365/226 |
| 2007/0263465 | A1 * | 11/2007 | Lee | 365/203 |

FOREIGN PATENT DOCUMENTS

| | | |
|---|---|---|
| JP | 64-054756 | 3/1989 |
| JP | 06-068672 | 3/1994 |
| JP | 07-254281 | 10/1995 |
| JP | 2007-079075 | 3/2004 |
| JP | 2007-058979 | 3/2007 |

OTHER PUBLICATIONS

Khellah, Muhammad et al. "Wordling & Bitline Pulsing Schemes for Improving SRAM Cell Stability in Low-Vcc 65mn CMOS Designs," 2006 Symposium on VLSI Circuits Digest of Technical Papers.

* cited by examiner

*Primary Examiner* — Huan Hoang
*Assistant Examiner* — James G Norman
(74) *Attorney, Agent, or Firm* — McDermott Will & Emery LLP

(57) ABSTRACT

A voltage of a bit line connected to a memory cell is stepped up up to a power supply voltage by a precharge circuit. Before data is read from the memory cell, the voltage of the bit line is stepped down to a voltage level lower than the power supply voltage by a step-down circuit. A precharge switching element controls a connection between a high-potential-side power supply and the precharge circuit and a connection between a low-potential-side power supply and the precharge circuit. A power supply connecting circuit is provided between the precharge switching element and the high-potential-side power supply. A ground connecting circuit is provided between a connecting point at which the precharge switching element is connected to the power supply connecting circuit and the low-potential-side power supply.

2 Claims, 7 Drawing Sheets

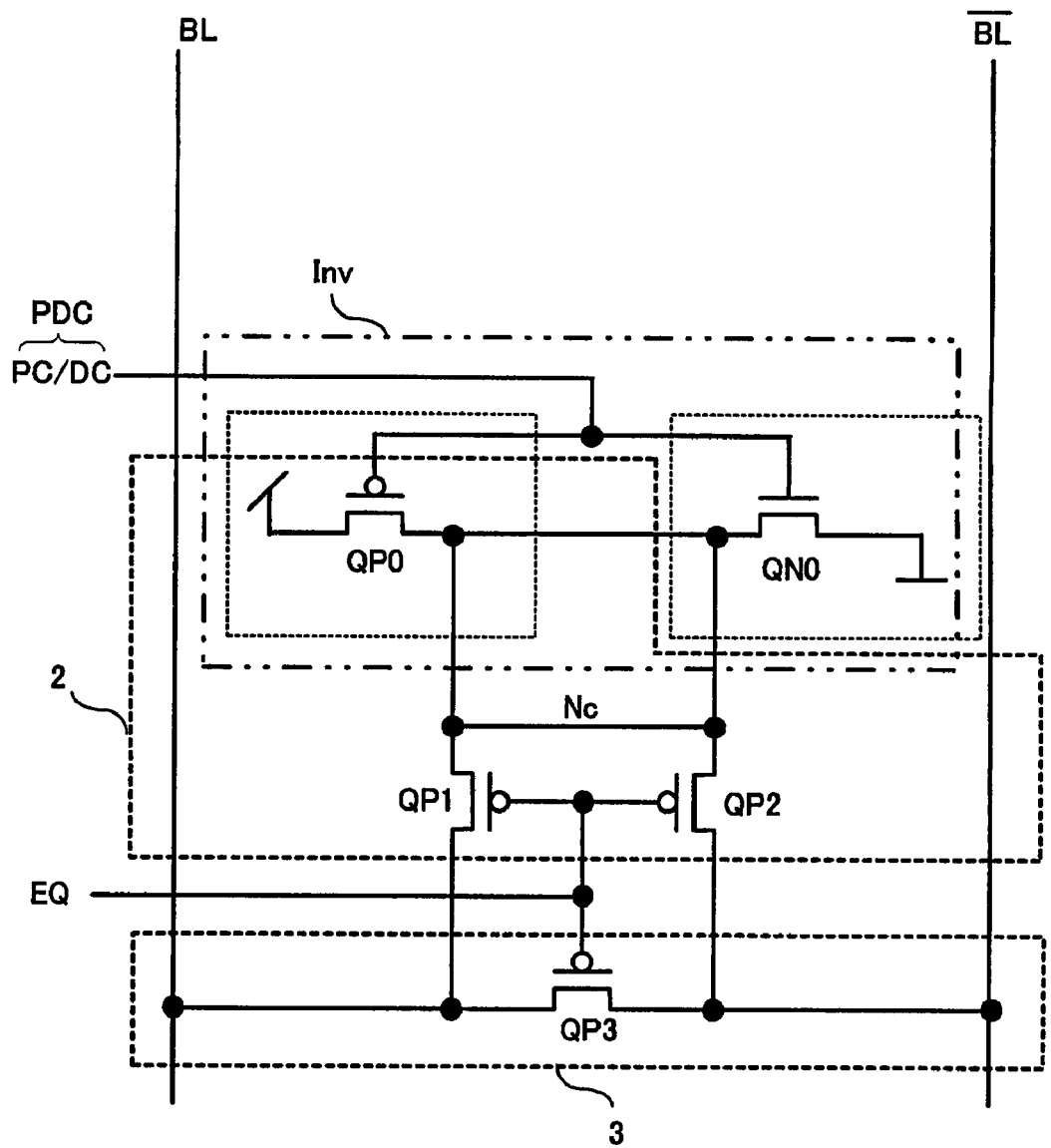
F I G. 5

PRIOR ART

SEMICONDUCTOR STORAGE DEVICE

BACKGROUND OF THE INVENTION

1. Field of the Invention

The present invention relates to a semiconductor storage device comprising a memory cell, a bit line connected to the memory cell, a precharge circuit which steps up a voltage of the bit line up to a power supply voltage, and a step-down circuit which steps down the voltage of the bit line to a voltage level lower than the power supply voltage before data is read from the memory cell.

2. Description of the Related Art

In the field of a semiconductor storage device, there is a conventional technology for improving a data reading speed by stepping down a bitline precharged with a power supply voltage to a voltage level lower than the power supply voltage before data is read so that the power supply voltage level in the bit line can change to a ground level sooner. The change from the power supply voltage level to the ground level in the bit line is detected by a PMO transistor at a subsequent gate. However, when a step-down level in the bit line is below an operation region of a transistor for detection, through current and a data-read error may occur. A similar data-read error also occur in the case where a sense amplifier or a PMOS cross driver is connected to the bit line. Therefore, it is necessary to keep a step-down level of the bit line around a threshold voltage of the PMOS transistor.

In a SRAM circuit where the bit line is precharged with the power supply voltage, charges of the power supply voltage level of the bit line flow into a node at which "L" data of SRAM is retained as soon as a word line is activated, in a non-selected column in which reading or writing is being performed. The inflow of too many charges at the time results in the generation of a data-write error. An indicator called a static noise margin shows a level of resistance against the data-write error. The static noise margin has been reduced in recent years as the semiconductor is increasingly miniaturized, and the data-write error is more likely to occur. In order to respond to the recent trend, there is a technology wherein a potential of the power supply voltage level of the bit line is stepped down so as to reduce the current flow into the node of the memory cell at which "L" data is stored when the word line is activated. When the voltage step-down level in the bit line at that time is not enough, the data-write error occurs due to the reason described above. When the voltage step-down level in the bit line is excessive, an data-write error is caused by charges of "L" level of the bit line which flow into the node at which "H" data of the SRAM is retained. Therefore, it is necessary to step down the voltage of the bit line to such a voltage level that can assure the static noise margin.

Below is described a technology for stepping down the voltage of the bit line in a conventional semiconductor storage device referring to FIGS. 7A and 7B. FIG. 7A is a circuit diagram illustrating a constitution of a conventional semiconductor storage device, and FIG. 7B is a timing chart illustrating an operation of the semiconductor storage device. In FIG. 7A, 11 denotes a SRAM memory cell, 12 denotes a precharge circuit, 13 denotes an equalizing circuit, 14 denotes a reading circuit, 15 denotes a step-down circuit, BL and /BL are complementary bit lines, WL denotes a word line, PC denotes a precharge control signal, DEC denotes a step-down/equalizing control signal, QP31, QP32 and QP 33 denote PMOS transistors constituting the precharge circuit 12, QP34 denotes a PMOS transistor constituting the equalizing circuit 13, QN31 and QN32 denote NMOS transistors constituting the step-down circuit 15, and Inv0 denotes an inverter.

The step-down circuit 15 comprising the step-down transistors QN31 and QN32 is additionally provided in order to step-down voltages of the bit lines BL and /BL prior to the activation of the word line WL. Sources of the step-down transistors QN 31 and QN32 are connected to the ground, drains thereof are directly connected to the bit lines BL and /BL, and gates thereof are connected to a gate of the equalizing transistor QP34 via the inverter Inv0. The gates of the step-down transistors QN 31 and QN32 are driven by the step-down/equalizing control signal DEC.

As shown in FIG. 7B, prior to the activation of the word line WL, the precharge control signal PC is negated and turns to "H" level at a timing t31, the precharge transistors QP31 and QP32 and the equalizing transistor QP33 are turned off, which leaves the bit lines BL and /BL in a floating state.

At a timing t32, the step-down/equalizing control signal DEC is asserted and turns to "H" level, and the step-down transistors QN31 and QN32 in the step-down circuit 15 are turned on. Further, the equalizing transistor QP34 in the equalizing circuit 13 is turned on, charges of the bit line BL and /BL are then discharged, and potentials of the bit lines BL and /BL are stepped down to a predetermined voltage level. A possible example of the predetermined voltage level is VDD−Vth. VDD is a power supply voltage used for the precharge, and Vth is a threshold voltage of the MOS transistors.

When the step-down/equalizing control signal DEC is negated and turns to "L" level at a timing t33, the step-down transistors QN31 and QN 32 are turned off, and the equalizing transistor QP34 is turned off. As a result, the step-down and equalizing operations for the bit lines BL and /BL are halted.

At a timing t34, the word line WL is asserted, and data is read from the memory cell 11. In the case where "0" is stored in the memory cell 11, current flows from the bit line BL into the memory cell 11, and the potential of the bit line BL is lowered; however, the potential of the complementary bit line /BL is not stepped down. The state in which the bit line BL="L" level and the complementary bit line /BL="H" level is judged by the reading circuit 14 as "0" data. In the case where "1" is stored in the memory cell 11, the current flows from the complementary bit line /BL into the memory cell 11, and the potential of the complementary bit line /BL is lowered, however, the potential of the bit line BL is not stepped down. The bit line BL="H" level and the complementary bit line /BL="L" level is judged by the reading circuit 14 as "1" data. Broken lines denoting the potentials of the bit lines BL and /BL illustrate the potential reduction irrespective of whether the reduction occurs in the bit line BL or the complementary bit line /BL.

At a timing t35, the word line WL is at "L" level, and the data reading operation is terminated. At a timing t36, the precharge control signal PC is asserted and turns to "L" level, and the precharge transistors QP31 and QP32 and the equalizing transistor QP33 are turned on. Then, the bit lines BL and /BL are precharged with the power supply voltage.

In the foregoing description, the step-down levels of the bit lines BL and /BL are adjusted in accordance with a pulse width of the step-down/equalizing control signal DEC. Provided that the step-down level is ΔV, and the pulse width of the step-down/equalizing control signal DEC is Tw, ΔV∝Tw, which means that the step-down level ΔV is substantially in proportion with the pulse width Tw of the step-down/equalizing control signal DEC.

In the conventional technology, since the step-down transistors QN31 and QN32 of the step-down circuit 15 are directly connected to the bit lines BL and /BL, load capacities of the bit lines BL and /BL are increased, which results in the deterioration of a reading time in a data cycle of reading data from the memory cell.

Further, a timing of the termination of the step-down control is likely to vary when the load capacities of the bit lines BL and /BL are increased. As a result, the step-down levels of the bit lines BL and /BL also vary, which may result in a data-read error.

SUMMARY OF THE INVENTION

Therefore, a main object of the present invention is to provide a semiconductor storage device capable of reliably preventing the deterioration of a reading speed at the time when data is read from a memory cell by providing a bit line with a step-down circuit without any increase of a load capacity of the bit line, and capable of unfailingly preventing a data-read error by executing a stable step-down control.

In order to solve the foregoing problems, a semiconductor storage device according to the present invention comprises
 a memory cell;
 a bit line connected to the memory cell;
 a precharge circuit for stepping up a voltage of the bit line to a power supply voltage;
 a step-down circuit for stepping down the voltage of the bit line to a voltage level lower than the power supply voltage before data is read from the memory cell;
 a high-potential-side power supply and a low-potential-side power supply respectively connected to the precharge circuit; and
 a precharge switching element for controlling a connection between the high-potential-side power supply and the precharge circuit and a connection between the low-potential-side power supply and the precharge circuit, wherein
 a power supply connecting circuit is provided between the precharge switching element and the high-potential-side power supply, and
 a ground connecting circuit is provided between a connecting point at which the precharge switching element is connected to the power supply connecting circuit and the low-potential-side power supply.

The present invention exerts the following effect. When the precharge circuit is in assert state, the step-down circuit is in negate state. When the step-down circuit is in assert state, the prechrage circuit is in negate state. Thus, the precharage circuit and the step-down circuit are in the trade-off relationship in their operation states. In the present invention wherein the relationship is utilized, the precharge circuit is interposed between the step-down circuit and the bit line when the step-down circuit is connected to the bit line. More specifically, the precharge switching element which is turned on at the time of the precharge is provided in the precharge circuit, and one end of the precharge switching element is connected to the bit line, while the other end thereof is connected to the high-potential-side power supply. Then, the power supply connecting circuit is interposed between the precharge switching element and the high-potential-side power supply so that the precharge switching element and the high-potential-side power supply are not constantly connected to each other. Further, the connecting point at which the precharge switching element and the power supply connecting circuit are connected to each other is used as a control node, and the ground connecting circuit is interposed between the control node and the low-potential-side power supply. Accordingly, the control node and the low-potential-side power supply are not constantly connected to each other. The power supply connecting circuit is interposed between the control node and the high-potential-side power supply. The ground connecting circuit is interposed between the control node and the low-potential-side power supply so that the high-potential-side power supply and the low-potential-side power supply will not be electrically short-circuited to each other. The power supply connecting circuit and the ground connecting circuit are turned on and off in the trade-off manner.

At the time of the precharge, the power supply connecting circuit is turned on while the ground connecting circuit is kept in the OFF position. Accordingly, the bit line is connected to the high-potential-side power supply via the control node and the power supply connecting circuit, and the bit line is thereby precharged. At the time, the precharge switching element is ON.

In the step-down operation, the power supply connecting circuit is turned off, and the ground connecting circuit is turned on. Accordingly, the bit line is connected to the low-potential-side power supply via the control node and the ground connecting circuit, and the voltage of the bit line is stepped down. At the time, the precharge switching element is ON.

As described, the ground connecting circuit constituting the step-down circuit is connected to the node (control node) of the precharge switching element on the side of the high-potential-side power supply (side of the power supply connecting circuit). The ground connecting circuit is not directly connected to the bit line. The precharge switching element is interposed between the ground connecting circuit and the bit line. Accordingly, a load capacity of the bit line is prevented from increasing. As a result, it becomes possible to shorten the time which requires for carrying out charge and discharge of the bit line at the time of data read. Thereby, the data reading speed improves.

In the semiconductor storage device thus constituted, the power supply connecting circuit and the ground connecting circuit may be integrally constituted as an inverter which is turned on and off by a common precharge/step-down control signal. Because the precharge/step-down control signal serves as a control signal of the power supply connecting circuit and a control signal of the ground connecting circuit, an area reduction can be improved. Further, there are the following advantages: The on-off control of the power supply connecting circuit and the on-off control of the ground connecting circuit can be performed at the same time, which makes it difficult for through current to flow; and the influence of setup on input signals in the precharge circuit and the step-down circuit can be lessened because the precharge/step-down control signal serves as a control signal of the precharge circuit and a control signal of the step-down circuit.

In the semiconductor storage device thus constituted, the power supply connecting circuit and the ground connecting circuit may be equally connected to a group of bit lines for a plurality of columns corresponding to memory cells for a plurality of columns. Thus constituted, the sharing of the constituent elements can be realized, and a layout size can be largely reduced.

According to the present invention, the load capacity of the bit line can be prevented from increasing. Further, the speed at which the data is read from the memory cell can be prevented from deteriorating, and data-read errors can be reliably prevented from happening.

The technology according to the present invention can control the increase of the load capacity of the bit line and prevent the speed at which the data is read from the memory cell from deteriorating. Therefore, the technology is advantageously applied to a semiconductor storage device such as SRAM for which a higher reading speed is strongly demanded.

BRIEF DESCRIPTION OF THE DRAWINGS

These and other objects as well as advantages of the invention will become clear by the following description of preferred embodiments of the invention and be specified in the claims attached hereto. A number of benefits not recited in this specification will come to the attention of the skilled in the art upon the implementation of the present invention.

FIG. 5 is a circuit diagram illustrating an equivalent circuit according to the preferred embodiment 2.

DETAILED DESCRIPTION OF THE INVENTION

Figure 1:
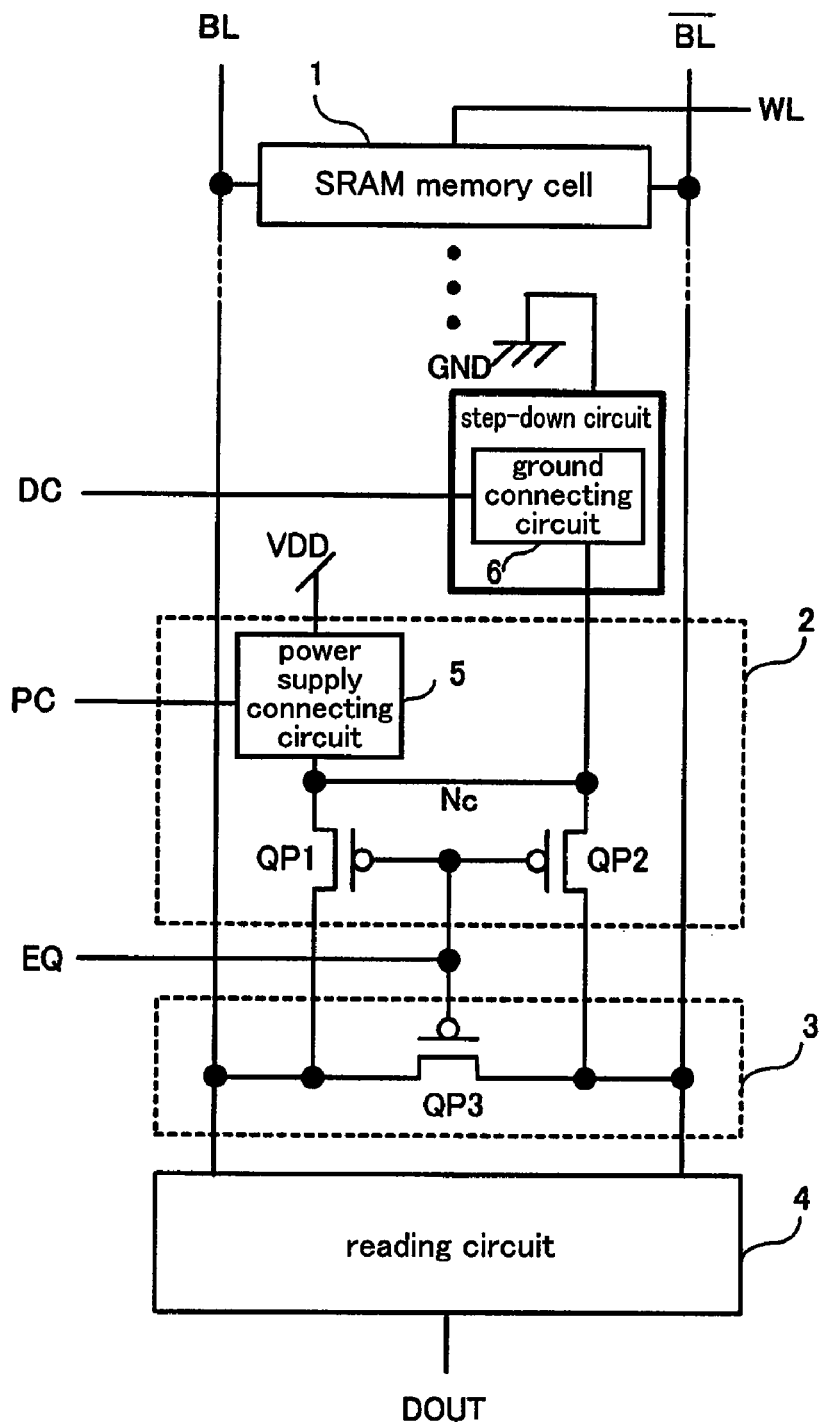
FIG. 1 is a circuit diagram illustrating a constitution of a semiconductor storage device according to a preferred embodiment 1 of the present invention.

Hereinafter, preferred embodiments of the present invention are described referring to the drawings.

Preferred Embodiment 1

FIG. 1 is a circuit diagram illustrating a constitution of a semiconductor storage device according to a preferred embodiment 1 of the present invention. Bit lines BL and /BL are connected to sources of a pair of access transistors in a memory cell 1 of SRAM (Static Random Access Memory) activated by access from a word line WL. A precharge circuit 2, an equalizing circuit 3 and a reading circuit 4 are connected to the bit lines BL and /BL. The equalizing circuit 3 comprises an equalizing transistor QP3. A PMOS transistor constitutes the equalizing transistor QP3. A source and a drain of the equalizing transistor QP3 are connected to the bit lines BL and /BL, and an equalizing control signal EQ is applied to a gate thereof. The precharge circuit 2 comprises switching transistors QP1 and QP2, which are PMOS transistors serving as precharge switching elements, and a power supply connecting circuit 5. A ground connecting circuit 6, which is a step-down circuit, is connected to the bit lines BL and /BL with the precharge circuit 2 interposed therebetween. A source of the precharge transistor QP1 is connected to the bit line BL, and a source of the precharge transistor QP2 is connected to the bit line /BL. A gate of the precharge transistor QP1 and a gate of the precharge transistor QP2 are connected to each other, and further connected to the gate of the equalizing transistor QP3. A drain of the precharge transistor QP1 and a drain of the precharge transistor QP2 are connected to each other, thereby serving as a control node Nc. The control node Nc is connected to a high-potential-side power supply (VDD) via the power supply connecting circuit 5, and further connected to a low-potential-side power supply (GND) via the ground connecting circuit 6. The power supply connecting circuit 5 is turned on and off by a precharge control signal PC to thereby connect/disconnect the control node Nc with respect to the high-potential-side power supply. The ground connecting circuit 6 is turned on and off by a step-down control signal DC to thereby connect/disconnect the control node Nc with respect to the low-potential-side power supply. The ON-OFF control by the power supply connecting circuit 5 and the ON-OFF control by the ground connecting circuit 6 are related to each other in a trade-off manner.

The ground connecting circuit 6 constitutes a main constituent of a step-down function. The main constituent of the step-down function is not directly connected to the bit lines BL and /BL, but is connected to the bit lines BL and /BL with the switching transistors QP1 and QP2 interposed therebetween. The present invention is characterized in that the main constituent of the step-down function is thus provided in the bit lines BL and /BL with the switching transistors QP1 and QP2 interposed therebetween. Because of the constitution thus described, load capacities of the bit lines BL and /BL can be prevented from increasing.

Figure 2:
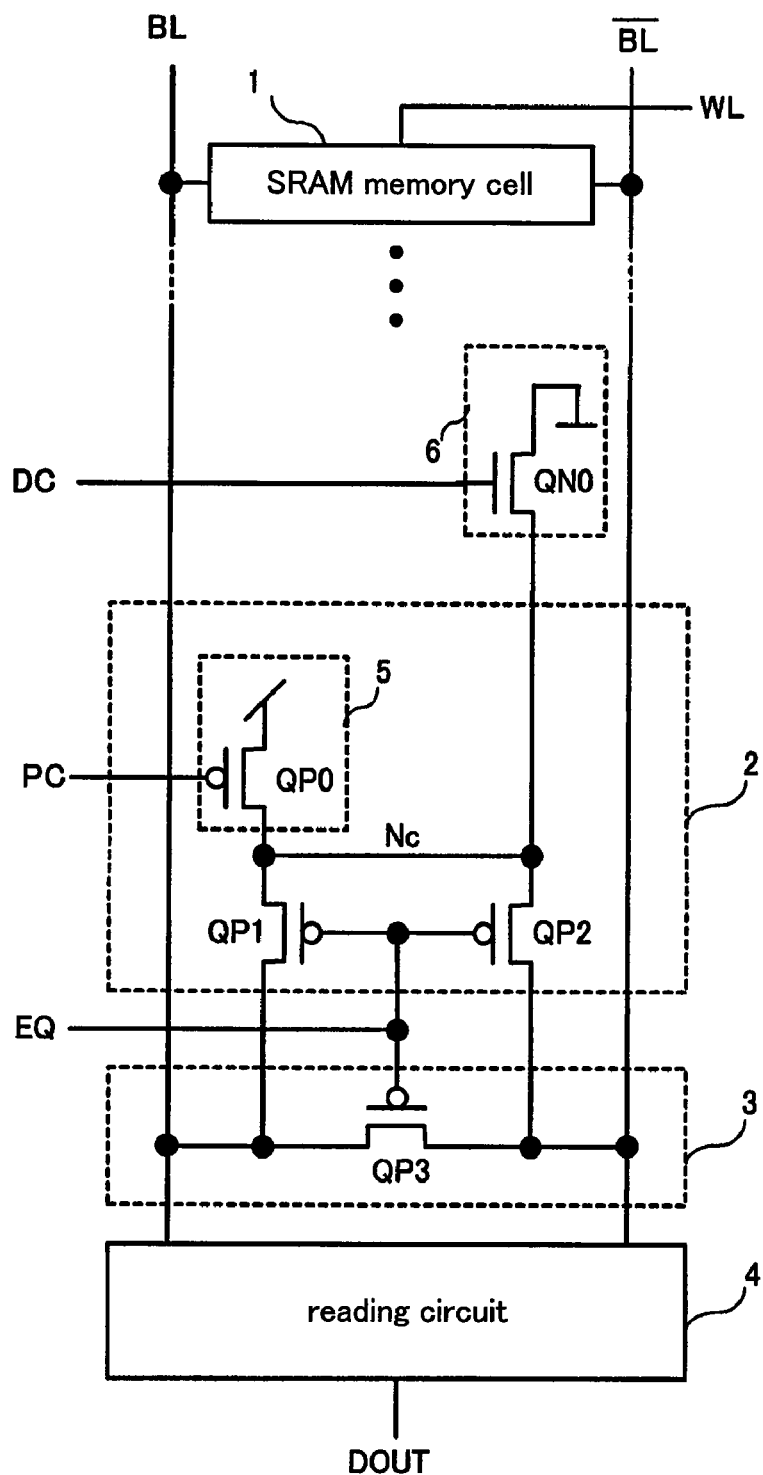
FIG. 2 is a circuit diagram specifically illustrating a power supply connecting circuit and a ground connecting circuit according to the preferred embodiment 1.

FIG. 2 is a circuit diagram specifically illustrating the power supply connecting circuit 5 and the ground connecting circuit 6 shown in FIG. 1. A PMOS precharge transistor QP0 constitutes the power supply connecting circuit 5, and an NMOS step-down transistor QN0 constitutes the ground connecting circuit 6. A source of the precharge transistor QP0 in the power supply connecting circuit 5 is connected to the high-potential-side power supply, a drain thereof is connected to the control node Nc, and the precharge control signal PC is applied to a gate thereof. A source of the step-down transistor QN0 in the ground connecting circuit 6 is connected to the low-potential-side power supply, a drain thereof is connected to the control node Nc, and the step-down control signal DC is applied to a gate thereof.

Figure 3:
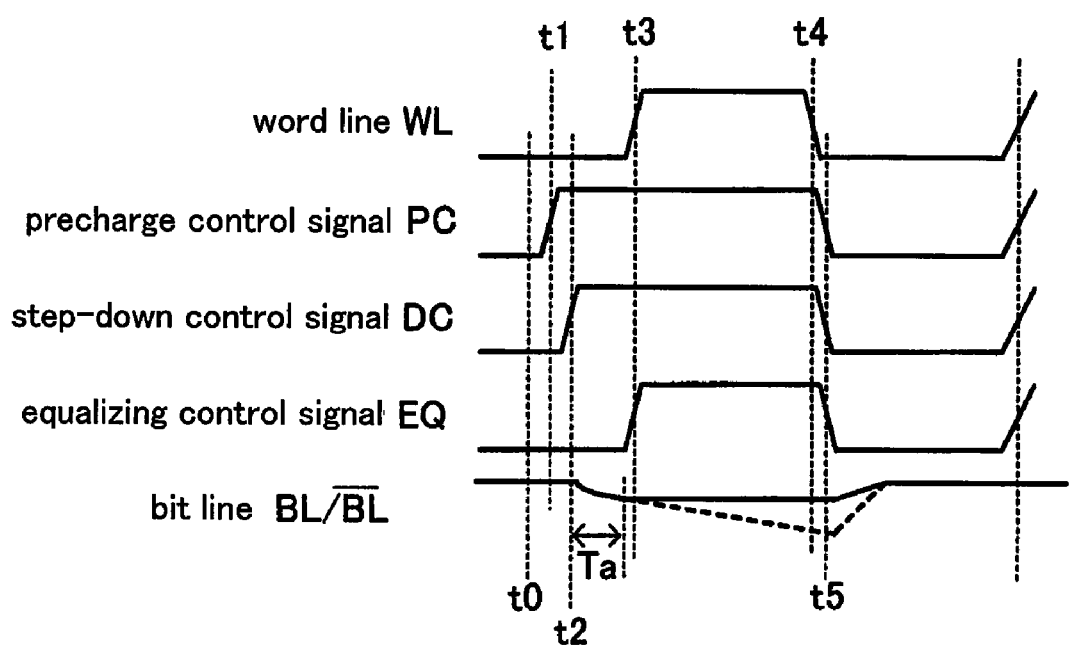
FIG. 3 is a timing chart illustrating an operation of the semiconductor storage device according to the preferred embodiment 1.

An operation of the semiconductor storage device thus constituted according to the present preferred embodiment is described referring to a timing chart shown in FIG. 3. At a timing t0, the low-active precharge control signal PC is in assert state, the step-down control signal DC is in negate state, and the low-active equalizing control signal EQ is in assert state. Because the precharge control signal PC is at "L" level, the precharge transistor QP0 is in the ON state, and a potential of the control node Nc is the power supply voltage VDD. Further, the equalizing control signal EQ is at "L" level; therefore, the switching transistors QP1 and QP2 and the equalizing transistor QP3 is in the ON state. Accordingly, the power supply voltage VDD of the control node Nc is applied to the bit lines BL and /BL, and the bit lines BL and /BL are thereby precharged.

Prior to the activation of the word line WL (t3), at a timing t1, the precharge control signal PC is negated to turn to "H" level, and the precharge transistor QP0 is thereby turned off. Then, the control node Nc is disconnected from the power supply voltage VDD, which leaves the bit lines BL and /BL in a floating state. At the time, the switching transistors QP1 and QP2 remain in the ON state.

At a timing t2, the step-down control signal DC is asserted to turn to "H" level. Then, the step-down transistor QN0 in the OFF state so far is turned on, and a potential of the control node Nc is stepped down to the ground level. Because the switching transistors QP1 and QP2 are in the ON state at the time, the voltages of the bit lines BL and /BL are stepped down in response to the potential drop in the control node Nc. The potentials of the bit lines BL and /BL are stepped down along with a certain time constant and to a predetermined voltage level. A possible example of the predetermined voltage level is VDD−Vth. Vth is a threshold voltage of the MOS transistors. At the time, a step-down speed in the bit line is lower as the voltage is closer to the predetermined voltage. Therefore, variability in a time length from the time when the step-down transistor QN0 is turned on to the time when the switching transistors QP1 and QP2 are turned on and variability in the step-down level resulting from the characteristic variability of the step-down transistor QN0 can be controlled.

At a timing t3, the equalizing control signal EQ is negated to turn to "H" level. At the time, the switching transistors QP1 and QP2 are turned off, and the step-down transistor QN0 is thereby completely disconnected from the bit lines. Immediately after that, the word line WL is activated to turn to "H" level. When the equalizing control signal EQ turns to at "H" level, the switching transistors QP1 and QP2 are turned off and thereby disconnected from the ground, which stops the step-down operation for the bit lines BL and /BL. Further, the equalizing transistor QP3 is turned off, which stops the equalizing operation for the bit lines BL and /BL. Since the word line WL is at "H" level, data is read from the memory cell 1. The reading operation at the time is similar to that of the conventional technology.

According to the present preferred embodiment, the step-down transistor QN0, which is the main constituent of the step-down function, is not directly connected to the bit lines BL and /BL, and the switching transistors QP1 and QP2 are interposed therebetween. Accordingly, the load capacities of the bit lines BL and /BL can be prevented from increasing. Further, during the reading operation, the time constant used when the bit lines BL and /BL shift from the power supply voltage VDD to the ground level is lessened so that the data can be read at a high speed. Provided that an amount of time necessary for the data read in the conventional technology is Tu and an amount of time necessary for the data read according to the present invention is Ta, Ta<Tu.

The PMOS transistors are used as the switching transistors QP1 and QP2. Accordingly, during the step-down operation, when the voltages of the bit lines BL and /BL are stepped down, source–drain voltages in the switching transistors QP1 and QP2 are reduced, and the step-down capacities of the PMOS transistors QP1 and QP2 are lessened. As a result, variability of the step-down levels in the bit lines can be effectively alleviated in the case where a timing of terminating the step-down control varies.

Preferred Embodiment 2

Figure 4A:
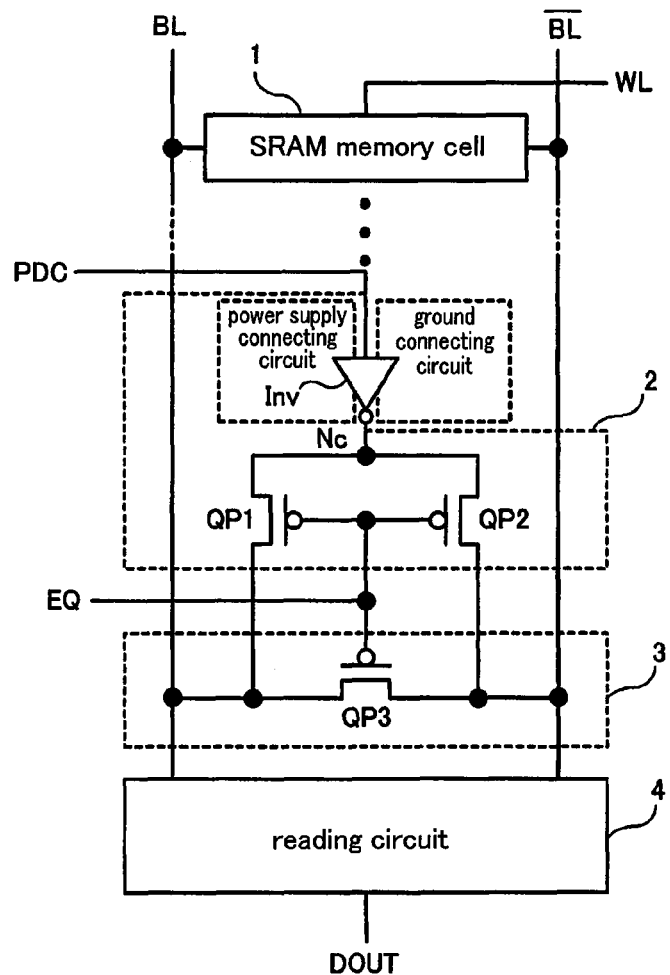
FIG. 4A is a circuit diagram illustrating a constitution of a semiconductor storage device according to a preferred embodiment 2 of the present invention.

FIG. 4A is a circuit diagram illustrating a constitution of a semiconductor storage device according to a preferred embodiment 2 of the present invention. FIG. 5 is a circuit diagram illustrating an equivalent circuit shown in FIG. 4A. The gate of the precharge transistor QP0 and the gate of the step-down transistor QN0 are connected to each other, and these transistors QP0 and QN0 constitute an inverter Inv. The precharge transistor QP0 and the step-down transistor QN0 are controlled by a precharge/step-down control signal PDC which is a control signal common to them.

Figure 4B:
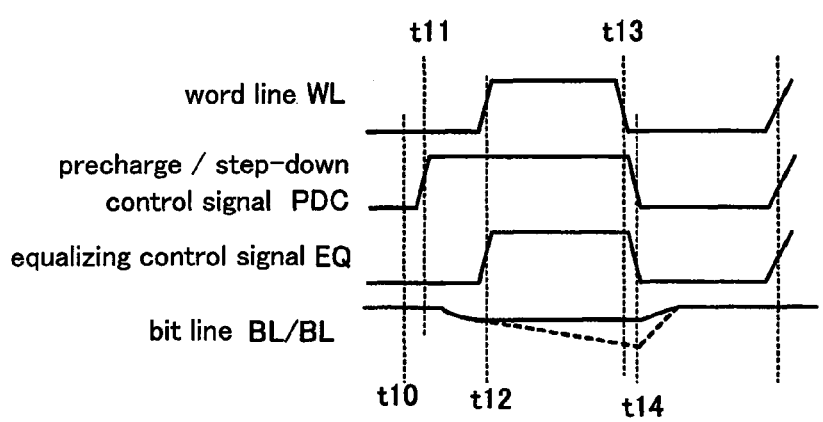
FIG. 4B is a timing chart illustrating an operation of the semiconductor storage device according to the preferred embodiment 2.

An operation of the semiconductor storage device thus constituted according to the present preferred embodiment is described referring to a timing chart shown in FIG. 4B. At a timing t10, the precharge/step-down control signal PDC is at "L" level, and the low-active equalizing control signal EQ is in assert state. Because the precharge/step-down control signal PDC is at "L" level, the precharge transistor QP0 is in the ON state, while the step-down transistor QN0 is in the OFF state, and the potential of the control node Nc is accordingly the power supply voltage VDD. Because the equalizing control signal EQ is at "L" level, the switching transistors QP1 and QP2 and the equalizing transistor QP3 is in the ON state. Accordingly, the power supply voltage VDD of the control node Nc is applied to the bit lines BL and /BL, and the bit lines BL and /BL are precharged.

Prior to the activation of the word line WL (t12), at a timing t11, the precharge/step-down control signal PDC turns to "H" level, and as soon as the precharge transistor QP0 is turned off, the step-down transistor QN0 is turned on. Accordingly, the control node Nc is disconnected from the power supply voltage VDD and connected to the ground at the same time. At the time, the switching transistors QP1 and QP2 are in the ON state; therefore, the voltages of the bit lines BL and /BL are stepped down in response to the potential drop of the control node Nc. The potentials of the bit lines BL and /BL are stepped down along with a certain time constant and to a predetermined voltage level (VDD−Vth).

At a timing t12, the equalizing control signal EQ is negated to turn to "H" level, and the word line WL is activated to turn to "H" level. When the equalizing control signal EQ is at "H" level, the switching transistors QP1 and QP2 are turned off, and thereby disconnected from the ground, which stops the step-down operation for the bit lines BL and /BL. Further, the equalizing operation for the bit lines BL and /BL also stops since the equalizing transistor QP3 is turned off. Since the word line WL is at "H" level, data is read from the memory cell 1.

At a timing t13, the word line WL is at "L" level, and the data reading operation is terminated. At a timing t14, the precharge/step-down control signal PDC turns to "L" level, and the control node Nc is precharged with the power supply voltage. At the same time, the equalizing control signal EQ is asserted, and the switching transistors QP1 and QP2 and the equalizing transistor QP3 are turned on. Accordingly, the bit lines BL and /BL are precharged with the power supply voltage.

According to the present preferred embodiment, the precharge/step-down control signal PDC is shared for the control signal for the power supply connecting circuit 5 (precharge transistor QP0) and the control signal for the ground connecting circuit 6 (step-down transistor QN0), which improves an area reduction. Further, the on-off control of the power supply connecting circuit 5 and the ground connecting circuit 6 is perfomed at the same time. Therefore, variability in the step-down level and through current can be controlled even if there is a variation in the timing between the turn-off of the power supply connecting circuit 5 and the turn-on of the ground connecting circuit 6 or between the turn-on of the power supply connecting circuit 5 and the turn-off of the ground connecting circuit 6.

In the preferred embodiment 1, the control signals for the precharge circuit 2 are the precharge control signal PC and the step-down control signal DC. In the present preferred embodiment, however, only the prechareg/step-down control signal PDC is used. As a result, in the precharge circuit 2, the influence of setup on input signals is lessened.

Preferred Embodiment 3

Figure 6:
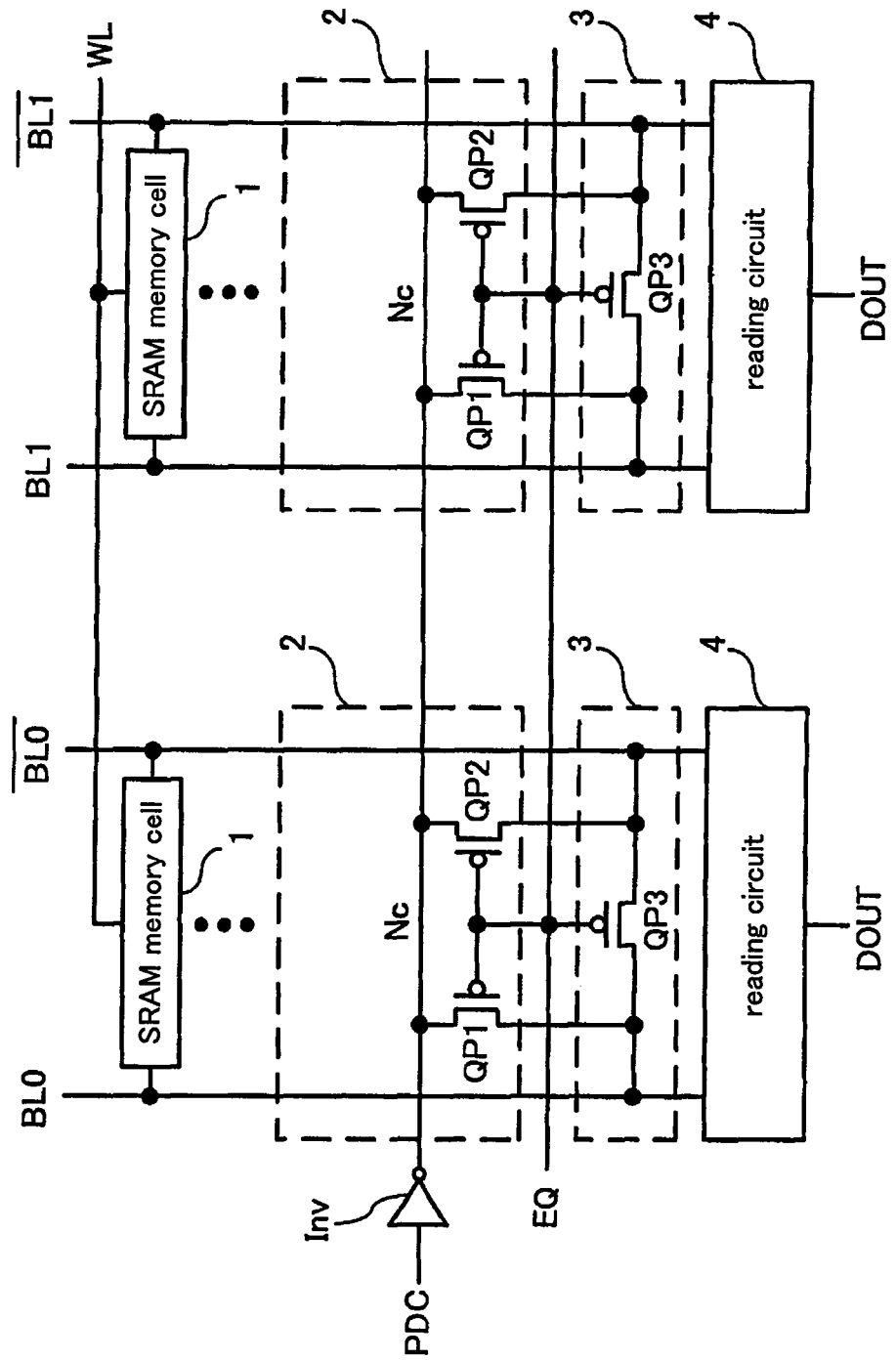
FIG. 6 is a circuit diagram illustrating a constitution of a semiconductor storage device according to a preferred embodiment 3 of the present invention.
Figure 7A:
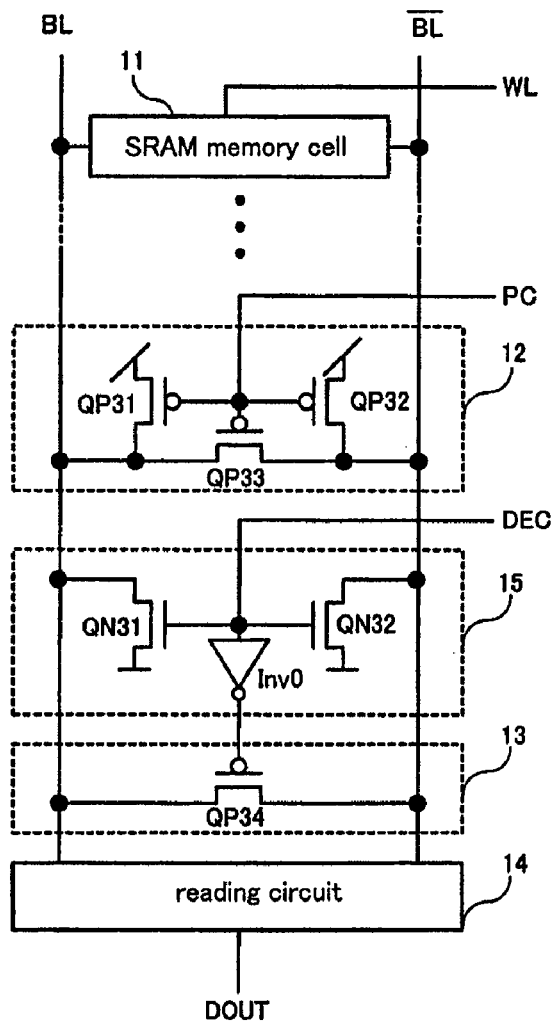
FIG. 7A is a circuit diagram illustrating a constitution of a semiconductor storage device according to the conventional technology.
Figure 7B:
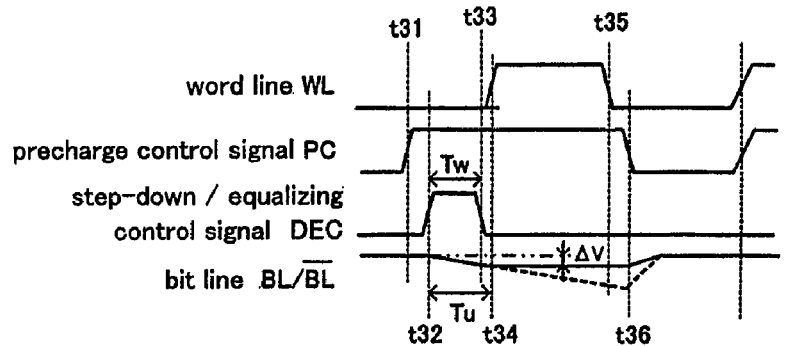
FIG. 7B is a timing chart illustrating an operation used in the conventional technology.

FIG. 6A is a circuit diagram illustrating a constitution of a semiconductor storage device according to a preferred embodiment 3 of the present invention. The inverter Inv is connected equally to the control nodes Nc in the precharge circuits 2 provided with the step-down function which are provided in a group of bit lines BL and /BL in a plurality of memory cells 1 parallel-arranged in a column direction. More specifically describing the constitution, the power supply connecting circuit 5 (precharge transistor QP0), ground connecting circuit 6 (step-down transistor QN0) and precharge/step-down control signal PDC are shared among the group of bit lines BL and /BL. An operation according to the present preferred embodiment is similar to that of the preferred embodiment 2. According to the present preferred embodiment, wherein the constituent elements are shared, a layout size can be largely reduced.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A semiconductor storage device comprising:
   a memory cell;
   a bit line connected to the memory cell;
   a precharge circuit for stepping up a voltage of the bit line to a power supply voltage;
   a step-down circuit for stepping down the voltage of the bit line to a voltage level lower than the power supply voltage before data is read from the memory cell;
   a high-potential-side power supply and a low-potential-side power supply respectively connected to the precharge circuit; and
   a precharge switching element for controlling a connection between the high-potential-side power supply and the precharge circuit and a connection between the low-potential-side power supply and the precharge circuit, wherein
   a power supply connecting circuit is connected to and between the precharge switching element and the high-potential-side power supply, and
   a ground connecting circuit is connected to and between a connecting point at which the precharge switching element is connected to the power supply connecting circuit and the low-potential-side power supply, and
   the power supply connecting circuit and the ground connecting circuit are integrally constituted as an inverter which is turned on and off by a common precharge/step-down control signal.

2. The semiconductor storage device as claimed in claim 1, wherein the power supply connecting circuit and the ground connecting circuit are equally connected to a group of bit lines for a plurality of columns corresponding to memory cells for a plurality of columns.

\* \* \* \* \*